United States Patent
Manocha

(10) Patent No.: US 7,498,891 B2
(45) Date of Patent: Mar. 3, 2009

(54) METHOD FOR CALIBRATION OF AN OSCILLATOR FOR A MICROCONTROLLER CHIP OPERATION

(75) Inventor: Vikas Manocha, Noida (IN)

(73) Assignee: STMicroelectronics Pvt. Ltd., Greater Noida (IN)

( * ) Notice: Subject to any disclaimer, the term of this patent is extended or adjusted under 35 U.S.C. 154(b) by 149 days.

(21) Appl. No.: 11/582,127

(22) Filed: Oct. 17, 2006

(65) Prior Publication Data

US 2007/0103245 A1    May 10, 2007

(30) Foreign Application Priority Data

Oct. 18, 2005    (IN) .................... 2785/DEL/2005

(51) Int. Cl.
*G01R 23/00*    (2006.01)
(52) U.S. Cl. .................... 331/44; 331/175; 331/14
(58) Field of Classification Search ................ 331/1 R, 331/14, 17, 1 A, 44, 175; 327/155, 160, 327/161; 702/89, 106, 107; 713/500, 501, 713/503
See application file for complete search history.

(56) References Cited

U.S. PATENT DOCUMENTS

| | | | | |
|---|---|---|---|---|
| 5,796,312 A | * | 8/1998 | Hull et al. | 331/44 |
| 6,043,749 A | * | 3/2000 | Saito et al. | 340/658 |
| 6,925,402 B2 | * | 8/2005 | Shah et al. | 702/89 |
| 7,250,825 B2 | * | 7/2007 | Wilson et al. | 331/44 |
| 7,268,633 B2 | * | 9/2007 | von Kaenel | 331/17 |
| 2001/0007091 A1 | * | 7/2001 | Walter et al. | 702/107 |

* cited by examiner

*Primary Examiner*—Robert Pascal
*Assistant Examiner*—Ryan J. Johnson
(74) *Attorney, Agent, or Firm*—Gardere Wynne Sewell LLP

(57) ABSTRACT

To calibrate an oscillator for microcontroller chip operation, an RC circuit is coupled to the microcontroller circuitry and a voltage signal is applied to the capacitor for changing the voltage across the capacitor. The voltage value across the capacitor is measured and compared to an expected voltage value. Adjustments to the frequency of the clock signal generated by the oscillator are made in response to the comparison.

20 Claims, 2 Drawing Sheets

METHOD FOR CALIBRATION OF AN OSCILLATOR FOR A MICROCONTROLLER CHIP OPERATION

PRIORITY CLAIM

The present application claims priority from Indian Application for Patent No. 2785/Del/2005 filed Oct. 18, 2005, the disclosure of which is hereby incorporated by reference.

BACKGROUND OF THE INVENTION

1. Technical Field of the Invention

The present invention relates to a method for calibration of an oscillator for a microcontroller chip operation.

2. Description of Related Art

Most computer systems today require various clock sources for the operation of different components in the system. Common clock sources use oscillators such as quartz and RC oscillators which are usually external to the system using the clock signal. More recently, several devices have started incorporating internal clock sources as this reduces the complexity of the chip by reducing the need for external pins and also reduces the need for the clock recovery circuitry. Quartz oscillators, although precise, are very expensive and hence are highly undesirable in mass usage applications requiring relatively low clock frequencies, e.g. 2-5 MHz. As most of the time, such systems are implemented on microcontrollers, there is a need of cheap and reliable clock sources for such microcontrollers.

The cheapest clocking method, for the applications requiring low clock frequencies, is to use internal RC oscillators as a clock source. RC oscillators are very cheap in comparison to the crystal oscillators and are normally built into the microcontrollers. Using internal RC oscillator reduces the cost in the mass production of electronic devices. However, the low cost RC oscillators have a few disadvantages in terms of reliability and speed. The frequency of the clock signal delivered by the RC oscillator is highly dependent on the operating environment, particularly on the temperature. The clock frequency variation also depends on the circuit design and the manufacturing process variations. In addition to this, an RC oscillator cannot be used for devices using high-speed clocks as the values of R and C have to be nominal to prevent excessive power loss and noise.

There are several calibration methods available for minimizing the frequency range variations in the RC oscillators. All these existing calibration methods/architecture use an external signal for a reference frequency. Reference is made to European Application 02291700.9 entitled "Method of Operating a Microcontroller Chip Having an Internal RC Oscillator and Microcontroller Chip Embodying the Method" which describes a calibration method and system with an RC oscillator using an external calibration clock source for capturing the reference frequency. The calibration ratio/values are derived based on the comparison of the RC oscillator clock frequency and the reference frequency. The calibration ratio/value is provided along with the uncalibrated clock to various blocks for performing different tasks. Hence, instead of altering the clock of the RC oscillator, the blocks are given the uncalibrated clock and the tasks are performed based on the calibration ratio/value.

The foregoing method/system has several disadvantages. In this method/system, the actual parameters of the reference signal are compared with the parameters calculated by the microcontroller. Hence, the methodology/architecture results in excessive burden in mass production of the chip as the reference signal has to be provided to every device for the calibration. Also the calibration factor/value has to be stored in the non-volatile memory location to get the calibrated clock after each power down. Absence of non-volatile memories in the controller would result in a need to recalibrate the clock with a reference signal every time the microcontroller is powered up. Also, if the memory of the device is erased/reprogrammed, the same recalibration procedure must be followed. Also, additional blocks are required in the peripheral devices for the acquisition of a clock signal with the reference signal frequency. There is also additional computational burden on the controller in calculating and using the calibration ratio.

Hence, there is need for a method for reliable calibration of low cost oscillators in microcontrollers. There is also need of method and system for calibration which reduces the requirement of additional blocks for clock generation. Furthermore, there is need for calibration technique which does not require an external reference signal.

SUMMARY OF THE INVENTION

An embodiment of the instant invention provides a method for calibration of an oscillator for a microcontroller chip operation, and a system using the method.

An embodiment of the instant invention provides a method for calibration of an internal RC oscillator which does not require an external reference signal An embodiment of the instant invention provides a calibrated internal clock with minimal additional processing blocks in the microcontroller.

In accordance with an embodiment, a method for calibration of an oscillator for a microcontroller chip operation comprises: initializing of said microcontroller chip with an input clock frequency; adjusting voltage to a first voltage level across a capacitor of a RC circuit connected to said microcontroller chip; inputting a reference voltage signal for fixed number of clock cycles in said capacitor; measuring a second voltage level across said capacitor after a predetermined duration; comparing said second voltage level with a threshold voltage level of said capacitor of said RC circuit; adjusting said input clock frequency of said oscillator responsive to results of said comparing; and repeating steps of said adjusting, said inputting, said measuring, said comparing and said adjusting responsive to results of said comparing until final calibration.

In accordance with another embodiment, a system comprises: a central processing unit; memory means for storing programs and data; an oscillator for providing clock signals to said central processing unit; calibration means for calibrating the frequency of said oscillator; wherein said calibration means comprises a RC circuit with the coupled node of resistor and capacitor connected to a data sensing means and said capacitor coupled to a first voltage level terminal at the other end; and wherein said resistor receives a voltage signal at the other end from said central processing unit for changing the voltage level across the capacitor and the oscillator is calibrated based on the voltage data sensed by said data sensing means.

In an embodiment, a system comprises an oscillator generating a clock signal at a particular frequency set in accordance with the contents of a configuration register, an RC circuit with a coupled node between resistor and capacitor, said capacitor being coupled to ground at an end other than the coupled node, and said resistor receiving a capacitor charging/discharging signal at an end other than the coupled node, a sensing circuit coupled to the coupled node to sense a voltage of the capacitor, and a processing unit which receives the clock signal and generates the capacitor charging/discharging signal based on the clock signal, compares the sensed capacitor voltage to an expected voltage, and modifies the configuration register based on the comparison.

In accordance with an embodiment, a method comprises generating a clock signal at a particular frequency set in accordance with a configuration value, applying that clock signal to a processing unit, generating by the processing unit of a capacitor charging/discharging signal based on the applied clock signal, applying the capacitor charging/discharging signal to an RC circuit, measuring a voltage across the capacitor of the RC circuit, comparing the sensed capacitor voltage to an expected voltage, and modifying the configuration value based on the comparison.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 1:
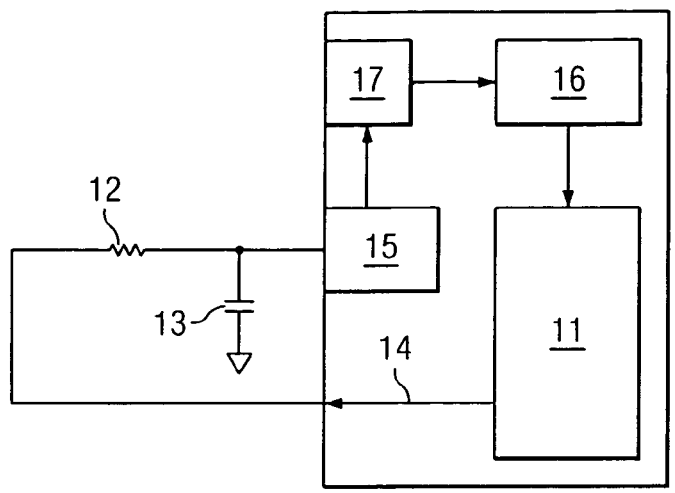
FIG. 1 illustrates the schematic diagram for the clock calibration device in the microcontroller in accordance with an embodiment of the instant invention.

Embodiments of the invention comprise a combination of hardware and a method using the hardware for the calibration of the clock oscillator. FIG. 1 illustrates a schematic diagram for an embodiment showing the hardware. The hardware comprises a basic processing unit 11, one resistor 12 and one capacitor 13 forming a microcontroller. It is assumed that the microcontroller circuit in the present embodiment comprises an Analog to Digital Converter (ADC) with a dedicated pin (collectively reference 15), an oscillator 16 which may be internal or external to the microcontroller, and a memory (M) 17. Additionally, the microcontroller may have an I/O pin 14 for coupling devices external to the microcontroller. These components are commonly found in present day microcontrollers.

An RC circuit comprising resistor 12 and capacitor 13 is included for calibrating the clock frequency of said oscillator 16. The RC circuit may be internal or external to the microcontroller chip. In the preferred embodiment, the resistor 12 is coupled to the Input Output (I/O) pin 14 of the microcontroller at one end and to an Analog to Digital converter (ADC) 15 pin in the microcontroller at the other end. Additionally, capacitor 13 is also coupled to the ADC 15 pin of the microcontroller at one end and the ground at the other end. A common DC power supply of 5V is used for driving all the components. The resistance 12 and capacitor 13 make an RC circuit for calibrating the internal oscillator. The capacitor 13 of the oscillator is charged and discharged by toggling any I/O pin 14 of the microcontroller. The internal ADC 15 of the microcontroller measures the capacitor voltage. Based on this measured value the calibration method is used to adjust the contents of the RC calibration resistor (RCCR) register in the oscillator 16. The oscillator 16 generates a particular frequency clock signal using the contents of the RCCR register. Based on this clock signal, I/O pin 14 charges or discharges capacitor 13 by providing a constant voltage (e.g., 5 V for charging and 0 V for discharging) for a fixed number of clock cycles. The measured value for the capacitor voltage is obtained iteratively to continuously modify the contents of the RCCR register until a desired measured value is obtained by the ADC 15. After calibration, the ADC 15 of the microcontroller can also be multiplexed to other pins (which is normally the case) and can be used after the calibration for other applications. The memory 17 is provided for storing data for operation of the oscillator and processing unit 11.

The concept of calibration requires the presence of RC circuit with resistor 12 and capacitor 13 coupled to the microcontroller circuitry. The charging/discharging time for capacitor 13 is fixed for the RC circuit with resistor 12 and capacitor 13. Based on this time, the voltage across capacitor 13 can be determined for different voltage signals based on the initial capacitor voltage and the duration of the charging/discharging signal. As the ideal frequency for the internal clock and the initial voltage across capacitor 13 are known, the voltage across capacitor 13 can be determined for a charging/discharging voltage signal applied for a fixed duration. The contents of the register RCCR are used to generate a clock signal for the core in the microcontroller. The core generates a voltage signal for the I/O pin 14 of the fixed duration. As the values of resistor 12 and capacitor 13 are known, the charging/discharging time for the RC circuit is known as well. This is used for determining the voltage across capacitor 13 for the voltage signal of the fixed duration. The voltage signal is used for charging or discharging the capacitor 13 and the internal ADC is used to obtain the measured capacitor voltage. The contents of RCCR register are modified to modify the voltage signal duration applied to capacitor 13 until the measured capacitor voltage is within acceptable range of the determined capacitor voltage.

Figure 2:
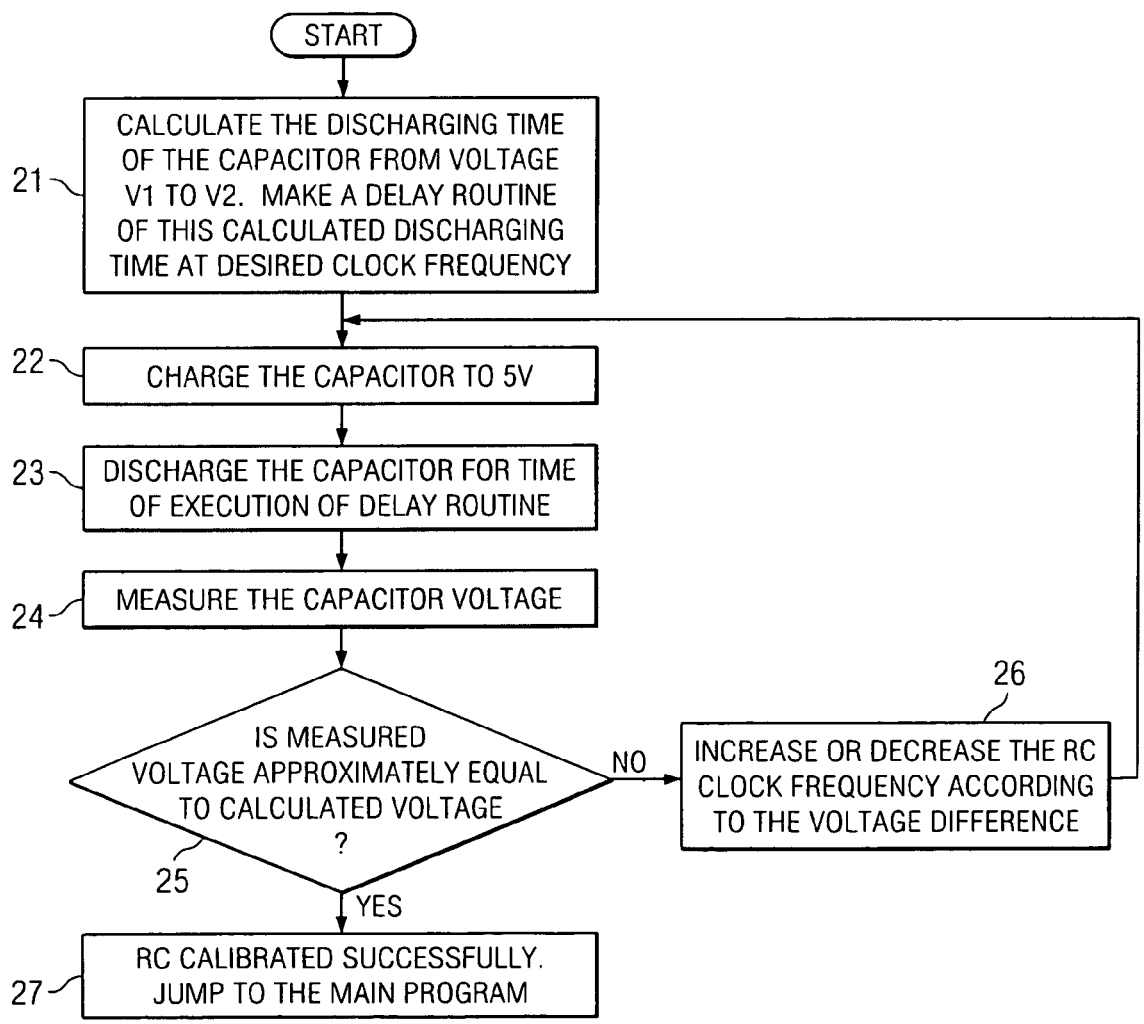
FIG. 2 illustrates the flowchart for the operation of calibration in the microcontroller in accordance with an embodiment of the instant invention.

FIG. 2 illustrates a flowchart describing the operation of calibration in the microcontroller. The present embodiment describes the case wherein a discharging signal of 0V is applied for discharging of the capacitor 13 charged at 5V. The method involves initially fixing one value of RCCR register. The initial contents of the RCCR register are set for a desired clock frequency assuming the case of an ideal oscillator with zero frequency variation. Simultaneously, the discharging time for capacitor 13 is determined for the RC circuit with resistor 12 and capacitor 13. Based on this time, a threshold voltage across capacitor 13 is determined for the case where the discharging signal is applied for a given time period. A delay routine is formed in the microcontroller for the given time period assuming an ideal clock generator (21).

The duration of the delay routine is actually dependent on the clock generated by a non-ideal oscillator as the processing unit 11 operates with a clock working at a frequency different from the desired frequency due to presence of secondary effects. Hence the adjustment is made to the duration of the delay routine by adjusting of the clock frequency and in the process calibrating the clock to desired frequency.

For calibration, the capacitor 13 is subsequently charged to 5V (22). A discharging signal of 0V is transmitted for the duration of the delay routine at the I/O pin 14. As the capacitor 13 is discharged (23), the capacitor voltage is measured using the internal ADC in the microcontroller after the discharging signal is turned off (24). This measured value is compared with the calculated threshold voltage (25). Based on the results of the comparison, if the difference between the measured and threshold voltages is not within the specified range, the contents of RCCR register are changed for adjusting the clock signal (26) and the calibration process (22-26) is repeated. If the measured value is smaller then threshold voltage, the RCCR register contents are adjusted to increase the internal clock frequency. On the other hand, if the measured value is bigger then threshold voltage, the internal clock frequency is reduced. Once the measured value is approximately equal to the threshold voltage, the clock is considered to be calibrated and the calibration process is stopped (27).

Hence, the internally determined threshold voltage is used as the reference for calibrating the delay routine duration and consequently, calibrating the internal clock. The execution time of the delay routine varies according to the internal clock at which the processing unit 11 is running. The desired charging/discharging of the capacitor 13 to the threshold voltage level is possible only at a particular clock frequency which is the desired clock frequency for the microcontroller operation.

Figure 3:
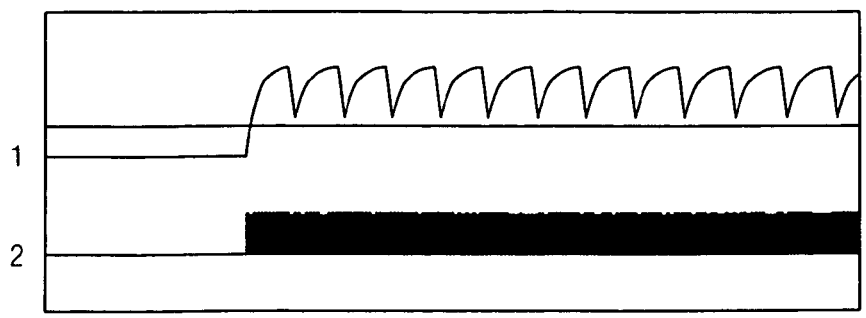
FIG. 3 illustrates the charging and discharging of the capacitor during the calibration of the oscillator in accordance with an embodiment of the instant invention.
Figure 4:
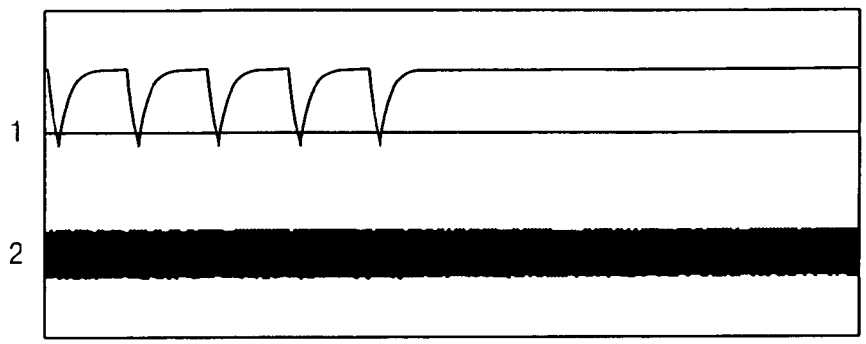
FIG. 4 illustrates the charging and discharging of the capacitor after the calibration of the oscillator in accordance with an embodiment the instant invention.
Figure 5:
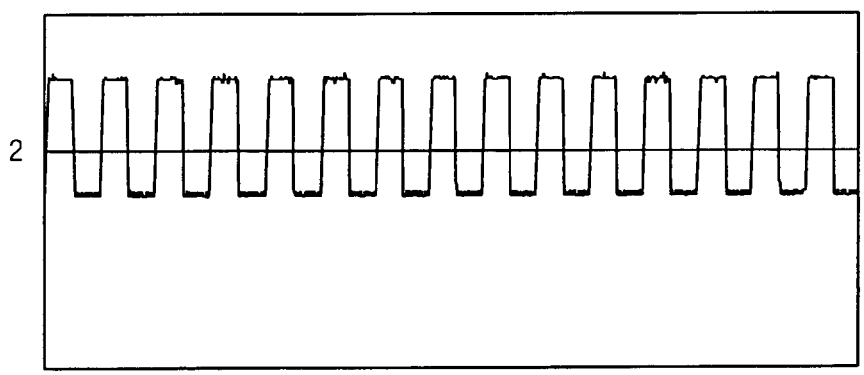
FIG. 5 illustrates the internal clock as the oscillator is being calibrated in accordance with an embodiment of the instant invention.
Figure 6:
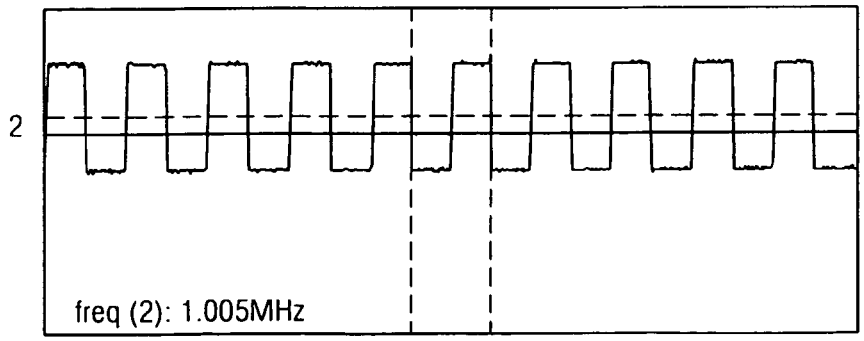
FIG. 6 illustrates the internal clock after the oscillator is calibrated in accordance with an embodiment of the instant invention.

The experimental results are illustrated by using a resistor 12 of 4.7 Kohm and a capacitor 13 of 4.7 µF. FIG. 3 and FIG. 4 illustrate the charging and discharging of the capacitor 13 during the calibration. After every set of charging and discharging, the RCCR register contents changes by 1 leading to a change in clock frequency, which further leads to change in charging/discharging time. Change in the charging/discharging time is monitored by measuring the capacitor voltage using the internal ADC. Probe 2 in FIG. 3 shows the clock at which the controller is running which shows the frequency at start is around 1.5 MHz (FIG. 5 enlarged view). FIG. 4 also illustrates the calibration of the internal clock as the capacitor 13 charging and discharging sequence stops. This indicates calibration of the internal clock to the desired frequency (1 MHz in this case, FIG. 6 is the enlarged view of probe 2 of FIG. 4). It can be observed that as the internal clock is calibrated the clock period increases.

All documents cited in the description are incorporated herein by reference. The present invention is not to be limited in scope by the specific embodiments and examples which are intended as illustrations of a number of aspects of the invention and any embodiments which are functionally equivalent are within the scope of this invention. Those skilled in the art will know, or be able to ascertain using no more than routine experimentation, many equivalents to the specific embodiments of the invention described herein. These and all other equivalents are intended to be encompassed by the following claims.

What is claimed is:

1. A method comprising:
    a) initializing of a microcontroller chip with an input clock frequency from an oscillator;
    b) adjusting voltage to a first voltage level across a capacitor of a RC circuit connected to said microcontroller chip;
    c) inputting a reference voltage signal for a fixed number of clock cycles in said capacitor;
    d) measuring a second voltage level across said capacitor after a predetermined duration;
    e) comparing said second voltage level with a threshold voltage level of said capacitor of said RC circuit;
    f) adjusting said input clock frequency of said oscillator responsive to results of said comparing; and
    repeating b)-f) responsive to results of said comparing until final calibration.

2. The method of claim 1, wherein initializing comprises:
    setting contents of a RC calibration resistor (RCCR) register in said oscillator for generating a clock signal of said input clock frequency;
    determining required time for voltage change across said capacitor from said first voltage level to said threshold voltage level for capacitor in said RC circuit including said capacitor and a resistor of known values; and
    creating a delay routine for said required time assuming ideal operation for said oscillator.

3. The method of claim 2, wherein inputting of said voltage signal comprises:
    generating said clock signal by means of said oscillator;
    operating said delay routine with said clock signal; and
    generating said reference voltage signal of at least duration of said operating.

4. The method of claim 1, wherein said predetermined duration is the time required for said operating of said delay routine with said clock signal.

5. The method of claim 1, wherein measuring of said second voltage level comprises analog to digital converting of voltage across said capacitor by means of an analog to digital converter.

6. The method of claim 1, wherein comparing comprises determining a difference value between said second voltage level and said threshold voltage level.

7. The method of claim 1, wherein adjusting comprises adjusting the contents of a RCCR register by 1.

8. The method of claim 1, wherein said first voltage level is higher than said threshold voltage level.

9. The method of claim 8, wherein voltage level of said reference voltage signal is lower than said threshold voltage level.

10. The method of claim 1, wherein adjusting comprises increasing said input clock frequency of said oscillator for a positive difference value between said threshold voltage level and said second voltage level.

11. The method of claim 1, wherein adjusting comprises decreasing said input clock frequency of said oscillator for a negative difference value between said threshold voltage level and said second voltage level.

12. The method of claim 1, wherein adjusting comprises making no change in said input clock frequency subject to a fixed tolerance value exceeding a difference value between said threshold voltage level and said second voltage level.

13. The method of claim 1, wherein said repeating is performed in response to a difference value between said threshold voltage level and said second voltage level exceeding a fixed tolerance value.

14. The method of claim 1, wherein said first voltage level is lower than said threshold voltage level.

15. The method of claim 1, wherein level of said reference voltage signal is higher than said threshold voltage level.

16. The method of claim 1, wherein adjusting comprises decreasing said input clock frequency of said oscillator for a positive difference value between said threshold voltage level and said second voltage level.

17. The method of claim 1, wherein adjusting comprises increasing said input clock frequency of said oscillator for a negative difference value between said threshold voltage level and said second voltage level.

18. A system comprising:
    a central processing unit;
    a memory for storing programs and data;

an oscillator for providing clock signals to said central processing unit; and a calibration circuit for calibrating the clock frequency of said oscillator, wherein said calibration circuit comprises a RC circuit with a coupled node between resistor and capacitor connected to a data sensing circuit and said capacitor is coupled to a first voltage level terminal at an end other than the coupled node, and wherein said resistor receives a capacitor charging/discharging voltage signal at an end other than the coupled node from said central processing unit for changing the voltage level across the capacitor and the oscillator is calibrated based on the voltage data sensed by said data sensing means.

19. A system comprising:

an oscillator generating a clock signal at a particular frequency set in accordance with the contents of a configuration register;

an RC circuit with a coupled node between resistor and capacitor, said capacitor being coupled to ground at an end other than the coupled node, and said resistor receiving a capacitor charging/discharging signal at an end other than the coupled node;

a sensing circuit coupled to the coupled node to sense a voltage of the capacitor; and a processing unit which receives the clock signal and generates the capacitor charging/discharging signal based on the clock signal, compares the sensed capacitor voltage to an expected voltage, and modifies the configuration register based on the comparison.

20. A method comprising:

generating a clock signal at a particular frequency set in accordance with a configuration value;

applying that clock signal to a processing unit;

generating by the processing unit of a capacitor charging/discharging signal based on the applied clock signal;

applying the capacitor charging/discharging signal to an RC circuit for a fixed number of clock cycles;

measuring a voltage across the capacitor of the RC circuit after a predetermined duration;

comparing the sensed capacitor voltage to an expected voltage; and modifying the configuration value based on the comparison.

* * * * *